United States Patent [19]

Eberlein et al.

[11] 3,916,345

[45] Oct. 28, 1975

[54] VHF NAND GATE CRYSTAL OSCILLATOR

[75] Inventors: Delvin D. Eberlein; Jeremy S. Nichols, both of Minneapolis, Minn.

[73] Assignee: Sperry Rand Corporation, New York, N.Y.

[22] Filed: Oct. 30, 1974

[21] Appl. No.: 519,375

[52] U.S. Cl........... 331/116 R; 331/108 D; 331/158

[51] Int. Cl.$^2$.......... H03B 5/36

[58] Field of Search.......... 331/116 R, 158, 108 D

[56] References Cited

UNITED STATES PATENTS 3,829,790 8/1974 Macrander.......... 331/116 R X

OTHER PUBLICATIONS

Byers Jr., "Power your oscillator with ECL," Electronic Design, Aug. 1, 1968, pp. 70, 71.

Cola, "Looking for a 'universal' circuit," Electronic Design, Feb. 1, 1967, pp. 48–51.

*Primary Examiner*—Siegfried H. Grimm

*Attorney, Agent, or Firm*—Kenneth T. Grace; Thomas J. Nikolai; Marshall M. Truex

[57] ABSTRACT

A circuit that provides the active-bias of and the phase selection of a higher overtone frequency of a crystal oscillator is disclosed. The circuit includes two transistor-transistor-logic (TTL) inverting NAND gates on a single integrated circuit (IC) chip: a first NAND gate that functions as the active oscillator circuit; and, a second NAND gate that is DC feedback-coupled to function as an active bias signal source for the active oscillator circuit. The output of the active bias signal source establishes the operating point of the active oscillator circuit near the center of its signal transition region so that the generated output (oscillator) signal waveform may be established as a sine wave or as a square wave by the proper component (resistor) selection.

5 Claims, 2 Drawing Figures

VHF NAND GATE CRYSTAL OSCILLATOR

BACKGROUND OF THE INVENTION

Generators of clocking signals for the timing of digital functions in a data processing system are usually delay lines having various timing pulses derived by taps along its length. Such delay lines are costly, relatively large in volume and relatively inefficient in operation. The advent of inexpensive small scale integrated (SSI) packages has enabled the circuit designer to implement many prior art hybrid or discrete circuits using the advantages of the newest SSI packages. See the W. W. Davis U.S. Pat. No. 3,846,705. The present invention is directed toward such a novel use of a commercially available SSI package.

SUMMARY OF THE INVENTION

The present invention is directed toward a method of intercoupling the leads of a commercially available SSI circuit package to form a generator of periodic pulses which pulses may be utilized for various digital timing functions. The crystal oscillator circuit of the present invention utilizes a commercially available dual inverting gate, e.g., Raytheon Part No. RG 3422, that has two TTL inverting NAND gates on the same IC chip. A first NAND gate functions as the active circuit for the oscillator signal while the second NAND gate functions as the active circuit for the bias signal. The output of the bias signal active circuit establishes the operating point of the oscillator signal active circuit near the center of its signal transition region so that the waveform of the generated output signal may be established as a sine wave or as a square wave by the proper component selection. By having the two NAND gates on the same IC chip, the operating characteristics thereof are ensured such that the oscillator circuit is self-starting. The frequency of oscillation $f_0$ of the crystal oscillator circuit is determined by the oscillator circuit locking onto one of the resonant frequencies of the crystal. Frequency selectivity of the oscillator circuit is established by proper component selection and the method of the intercoupling thereof.

DESCRIPTION OF THE PREFERRED EMBODIMENT

Figure 1:
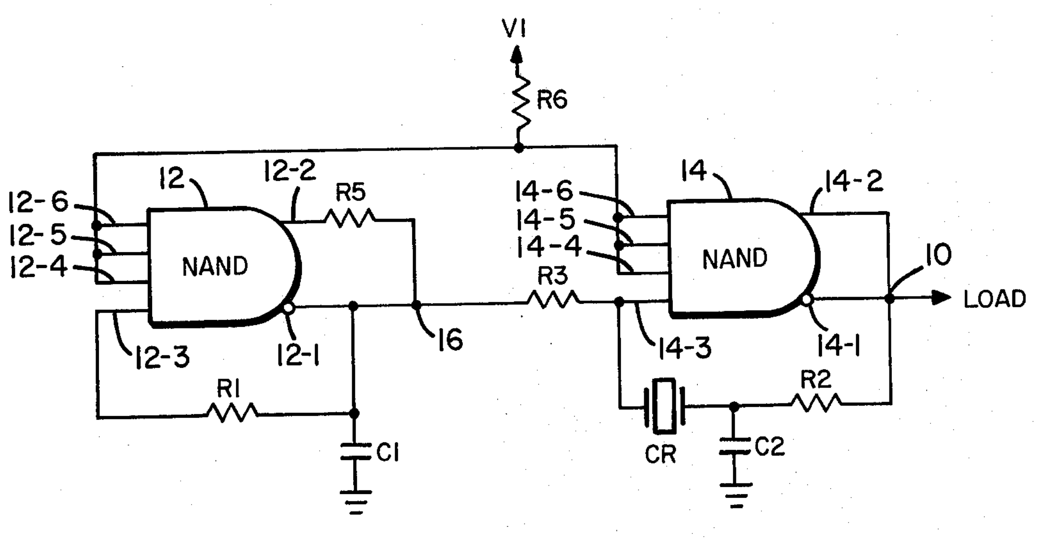
FIG. 1 is an illustration of the crystal oscillator circuit of the present invention.

With particular reference to FIG. 1 there is presented an illustration of the crystal oscillator circuit of the present invention. The illustrated oscillator circuit provides, at the oscillator output node 10, a 50 megahertz (MHz) output signal that is used as the base clock signal for a semiconductor memory having a 200 nanosecond (ns) cycle time. The present invention is directed toward a method of intercoupling the leads of a commercially available SSI circuit package, preferably a Raytheon dual inverting gate RG 3422, to form a generator of periodic pulses which pulses may be utilized for various digital timing functions.

The crystal oscillator circuit of FIG. 1 utilizes two TTL inverting gates, NANDs 12, 14, in which NAND 14 functions as the active circuit for the oscillator signal and in which NAND 12 functions as the active circuit for the bias signal. The output of the bias signal active circuit establishes the operating point of the oscillator signal active circuit near the center of its signal transition region so that the waveform of the generated output (oscillator) signal at node 10 may be established as a sine wave or as a square wave by the proper component (resistor) selection. By having the two NANDs 12, 14 on the same IC chip, the DC quiescent point of the bias circuit and the zero crossover point of the oscillator circuit will track each other ensuring that the oscillator circuit is self-starting.

The circuit requirements for NANDs 12, 14 differ at their output nodes 16, 10, respectively, with the intended use of the NAND gate. The standard totem-pole output transistor-pair of the TTL NAND 14 is necessary for the crystal oscillator circuit of FIG. 1 to provide adequate speed and symmetrical wave form; however, actively biasing such a standard totem-pole output transistor-pair in the transition region may exceed the maximum current rating for the totem-pole transition-pair. Note that this totem-pole configuration of the output transistor-pair of the TTL NAND 14 is achieved by the direct intercoupling of the inverting active pull-up output terminal 14-1 and the inverting active pull-down output terminal 14-2, as at node 10. The split-output capability of TTL NANDs 12, 14 (which split-output capability is available in the Raytheon dual inverting gate RG 3422 as it provides a separate inverting active pull-up output terminal, e.g., 12-1, and a separate inverting active pull-down output terminal, e.g., 12-2) permits the circuit designer to provide, on one IC chip, a standard totem-pole output transistor pair in one configuration for the oscillator signal active circuit of NAND 14 and a second split-output configuration for the bias signal active circuit of NAND 12 by the addition of a current limiting resistor R5 in series with the inverting active pull-up output terminal 12-1 and the inverting active pull-down output terminal 12-2 as at node 16.

The bias signal is established by a DC feedback-coupling via resistor R1 around the inverting gate of NAND 12. This DC feedback establishes the output of NAND 12 at node 16 at a DC quiescent point that is near the center of the transition region of the oscillator circuit output signal, as at node 10, with the output transistor-pair conducting steady state and thus necessitating the current limiting described above, i.e., R5. The bias signal output of the bias circuit, as at node 16, is used to establish the operating point of NAND 14 of the oscillator circuit near the center of its transition region about which operating point the oscillator output signal will oscillate as a sine wave. The DC quiescent point of NAND 12 and the zero crossover point of the NAND 14 will track each other as they are both on the same IC chip. This characteristic is very important to ensure that the oscillator circuit will be self-starting.

The frequency of oscillation $f_0$ of the oscillator circuit is determined by the oscillator circuit locking onto one of the resonant frequencies of the crystal CR. Since crystals with fundamental resonance in the VHF range are not available, crystals for the VHF range are cut for one of the overtone frequencies. Overtone crystal oscillators are very susceptible to locking onto the fundamental frequency of the crystal, and also have the possibility, as well, to lock onto one of the several higher overtone frequencies. Therefore, frequency selectivity is required to ensure that the oscillator circuit will lock onto only the specified overtone frequency.

Frequency selection of the crystal oscillator circuit of FIG. 1 is determined by the filter-like behavior of the crystal CR and by the phase relationship between the signals at the input and output terminals of NAND 14. A crystal inserted into the feedback path around an active oscillator circuit behaves as a very narrow band pass filter at each of its many resonant modes (fundamental and overtone frequencies) with sharp transitions separating the low insertion loss passbands from the high attenuation stopbands. Oscillation can only occur at those resonant modes in which the closed loop gain is greater than 1 and the total phase delay around the loop is an integral multiple of 360°. The crystal oscillator circuit of FIG. 1 is designed so that for resonant crystal frequencies below the selected overtone frequency $f_o$, the phase delay is less than 360° and for resonant crystal frequencies above the selected overtone frequency $f_o$, the closed loop gain is less than 1.

The crystal CR at any resonant mode has a 0° phase angle at the center frequency $f_c$ with low and high frequency asymptotic phases of +90° and −90° over a very narrow frequency band with a $\pm \Delta f$, where the band width is defined by the Q of the crystal at that resonant point.

$$Q = \frac{f_c}{2\,\Delta f} \qquad \text{(Eq. 1)}$$

Thus, the crystal can pull from the center frequency $f_c$ of a resonant mode to provide up to ±90° phase shift. For high Q crystals, $\Delta f/f_c \rightarrow$ O, the crystal appears to have a step phase response at the center frequency $f_c$.

To satisfy the 360° phase relationship for a positive feedback requires that the following assumptions be equal to an integral multiple of 360° at one of the resonant modes: polarity of the gate, phase shift equivalent of the gate's propagation delay, phase shift of the RC network, and any angle within the range of the crystal. By selecting an inverting gate, NAND 14, for the active gate, a 180° phase shift is introduced. The necessary phase condition is then $$-180° - 360° \times f_o \times t_{pd} - \theta_{RC} \pm \theta \text{ crystal} = -360° \equiv 0° \quad \text{(Eq. 2)}$$

The propagation delay, $t_{pd}$, can be written as follows:

$$t_{pd} = \frac{180° - \phi_{RC} \pm \phi \text{ crystal}}{360° f_o} \qquad \text{(Eq. 3)}$$

For resonant frequencies, $f_r$, below the desired frequency of oscillation, $f_o$, the angle of the RC network is very small and in the limit.

$$\phi_{RC} \rightarrow O \text{ for } f_r << f_o \qquad \text{(Eq. 4)}$$

Therefore, if the inverting gate delay is selected to satisfy the following inequality $$t_{pd} < \frac{90°}{360°}\,\frac{1}{f_r} = \frac{1}{4f_r} \qquad \text{(Eq. 5)}$$

for the highest resonant frequency, $f_r$, below the desired overtone frequency $f_o$, the oscillator circuit will phase reject all possible lower order resonant modes of oscillation. Higher resonant modes of oscillation above the one selected overtone frequency $f_o$ are attenuated by the low pass characteristics of the RC network formed of R2 and C2 for a closed loop gain of less than 1. Thus, the oscillator circuit will not support steady state oscillations at the higher frequencies (above $f_o$). At the selected overtone frequency of oscillation $f_o$, phase margins provided by the step phase response (+90° ↔ −90°) of crystal CR ensure that the oscillator circuit will be self-phase locking. By selecting an active oscillator circuit, NAND 14, with a typical propagation delay of $$\tilde{t}_{pd} = \frac{180° - \tilde{\phi}_{RC}}{360° f_o}$$

the ability of crystal CR to pull ±90° will provide margins for both $\pm \Delta\theta_{RC}$ and $\pm \Delta t_{pd}$. The input terminal 14-3 of the oscillator circuit and the output terminal 12-1 of the bias circuit are intercoupled by resistor R3. Resistor R3 functions as an element of the AC feedback path which in the prior art was normally accomplished by an inductor. The DC offset effect of the interstage isolation resistor R3 is cancelled by a compensation resistor R1 in the bias circuit DC feedback path. This cancellation is near ideal since both the bias circuit and the oscillator circuit art on the same IC chip; therefore, the bias currents will be nearly identical.

Figure 2:
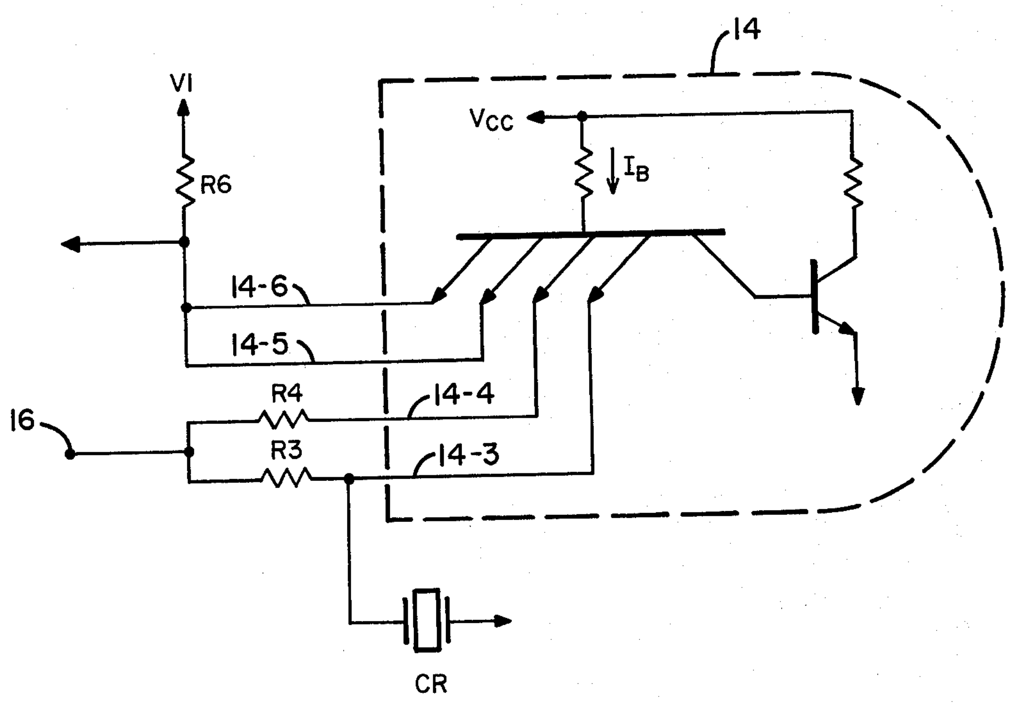
FIG. 2 is an illustration of one modification of the circuit of FIG. 1.

The symmetry of the wave form of the oscillator output signal at the output terminal of node 10 is determined by the frequency of oscillation $f_o$ and the loading at the output terminal. If necessary, the oscillator output signal can be varied from a symmetrical square wave (switching mode) to a symmetrical sine wave (linear mode) by the proper loading at node 10 and by limiting the base drive, $I_B$, that is available to the active oscillator gate circuitry, i.e., input terminal 14-3 of NAND 14 — see FIG. 2. By means of a resistor, $R_4$, a portion of the base current $I_B$ may be diverted from the oscillator signal active circuit on input terminal 14-3 to the bias signal active circuit at node 16 via input terminal 14-4.

In order to facilitate an understanding of the operation of the present invention, the following group of actual values for the components of the illustrated embodiment of FIG. 1 are presented. It should be understood that the principles of operation of this circuit may be present in circuits having a wide range of individual specifications, so that the list of values here presented should not be construed as a limitation thereto.

| | |
|---|---|
| NAND | Raytheon Part No. RG 3422 |
| Crystal CR | CTS Knights, Inc. |
| | Part No. H-3W-50MHz |
| Capacitors | |
| C1 | 47 pf |
| C2 | 1000 pf |
| Resistors | |
| R1, R2, R3 | 270 OHM ¼ watt |
| R4 | Omitted |
| R5 | 180 OHM ¼ watt |
| R6 | 1K OHM ¼ watt |
| V1 | + 5.0 Volts DC |

What is claimed is:

1. A VHF crystal oscillator, comprising:

first and second inverting gates, each having at least a first input and a first and second inverting outputs;

first resistor means for coupling the first inverting gate first input to the first inverting gate first inverting output;

first capacitor means for coupling the first inverting gate first inverting output to a first voltage source;

second resister means for coupling the first inverting gate second inverting output to the first inverting gate first inverting output;

first means for directly intercoupling the second inverting gate first and second inverting outputs and forming an oscillator output signal node;

serially coupled third resistor means and crystal means for serially intercoupling the second inverting gate first inverting output to the second inverting gate first input;

second capacitor means for coupling the common-coupled terminals of said third resistor means and said crystal means to a second voltage source;

fourth resistor means for coupling the first inverting gate first inverting output to the second inverting gate first input.

2. The oscillator of claim 1 in which said first and second inverting gates each have additional inputs all of which are coupled to a common third voltage source by a common fifth resistor means.

3. A VHF crystal oscillator, comprising:

first and second inverting gates, each having at least a first input terminal, an inverting active pull-up output terminal and an inverting active pull-down output terminal;

first resistor means for coupling the first inverting gate first input to the first inverting gate inverting active pull-up output terminal;

first capacitor means for coupling the first inverting gate inverting active pull-up output terminal to a first voltage source;

second resistor means for coupling the first inverting gate inverting active pull-down output terminal to the first inverting gate inverting active pull-up output terminal;

first means for directly intercoupling the second inverting gate inverting active pull-up output terminal and inverting active pull-down output terminal and forming an oscillator output signal node at their common-coupled output terminals;

serially coupled third resistor means and crystal means for serially intercoupling the second inverting gate inverting active pull-up output terminal to the second inverting gate first input;

second capacitor means for coupling the common-coupled terminals of said third resistor means and said crystal means to a second voltage source;

fourth resistor means for coupling the first inverting gate inverting active pull-up output terminal to the second inverting gate first input.

4. The oscillator of claim 3 further including fifth resistor means for coupling a second input terminal of said second inverting gate to the inverting active pull-up output terminal of said first inverting gate.

5. The oscillator of claim 3 in which said first and second inverting gates have additional input terminals all of which are coupled to a common third voltage source by a common sixth resistor means.

* * * * *